(12) United States Patent
Chun

(10) Patent No.: US 6,285,610 B1
(45) Date of Patent: Sep. 4, 2001

(54) BURN-IN TEST CIRCUIT

(75) Inventor: Jun-Hyun Chun, Cheongju (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/617,798

(22) Filed: Jul. 17, 2000

(30) Foreign Application Priority Data

Sep. 1, 1999 (KR) .................................................. 99-36878

(51) Int. Cl.[7] .................................................. G11C 29/00
(52) U.S. Cl. ........................... 365/201; 365/200; 365/222
(58) Field of Search .................................. 365/201, 200, 365/222

(56) References Cited

U.S. PATENT DOCUMENTS 5,452,253 * 9/1995 Choi ...................................... 365/201
6,108,252 * 8/2000 Park ...................................... 365/201

* cited by examiner

Primary Examiner—Huan Hoang
Assistant Examiner—Connie C. Yoha

(57) ABSTRACT

A burn-in test circuit for semiconductor memory device consisting of a memory cell array having a plurality of memory cells and a row decoder for outputting a word line drive signal so as to drive word lines of the memory cell array, includes a reference voltage generating unit for generating a reference voltage/a voltage sensing unit for sensing a power supply voltage level; a self-refresh timer for outputting a clock signal; a burn-in control unit for outputting a burn-in enable signal according to the output signal from the voltage sensing unit and the output signal from the self-refresh timer; an auto-refresh address counter for generating an internal address signal according to the burn-in enable signal of the burn-in control unit and the auto-refresh command; and a multiplexer for multiplexing the external address signal and the internal address signal under the control of the auto-refresh command and the burn-in control signal. In the semiconductor memory device using the burn-in test circuit of the present invention, the word lines are driven by controlling the level of the external power supply voltage VCC, rather than performing a burn-in testing according to an externally generated command, so that burn-in testing can be performed at the wafer and the package level at a low expense with high efficiency.

9 Claims, 7 Drawing Sheets

FIG. 3A BACKGROUND ART
FIG. 3B BACKGROUND ART
FIG. 3C BACKGROUND ART
FIG. 3D BACKGROUND ART
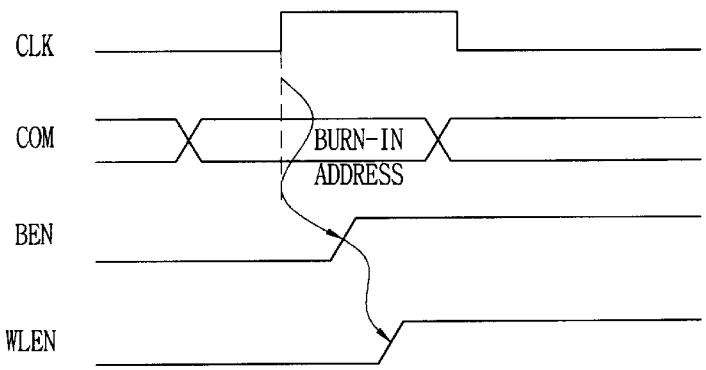
FIG. 4A BACKGROUND ART
FIG. 4B BACKGROUND ART
FIG. 4C BACKGROUND ART
FIG. 4D BACKGROUND ART
FIG. 4E BACKGROUND ART
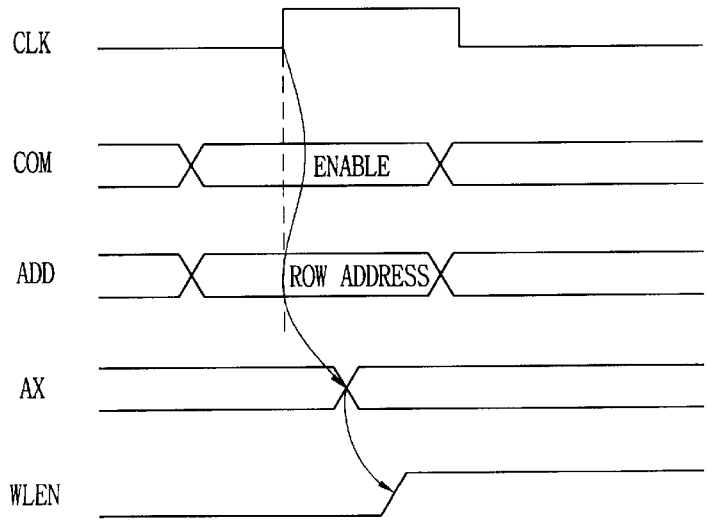

FIG. 7A  VCC
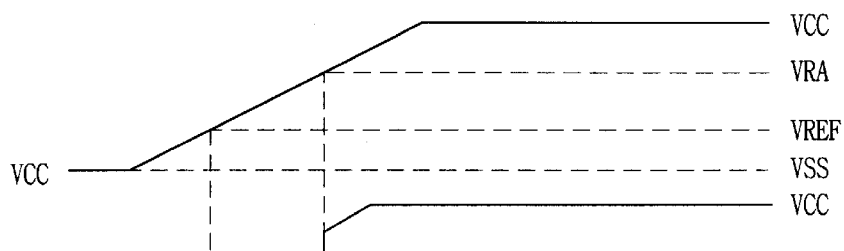
FIG. 7B  HVCC
FIG. 7C  PWON
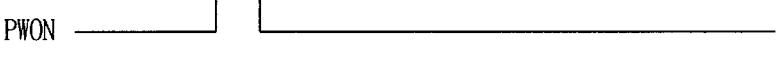
FIG. 8
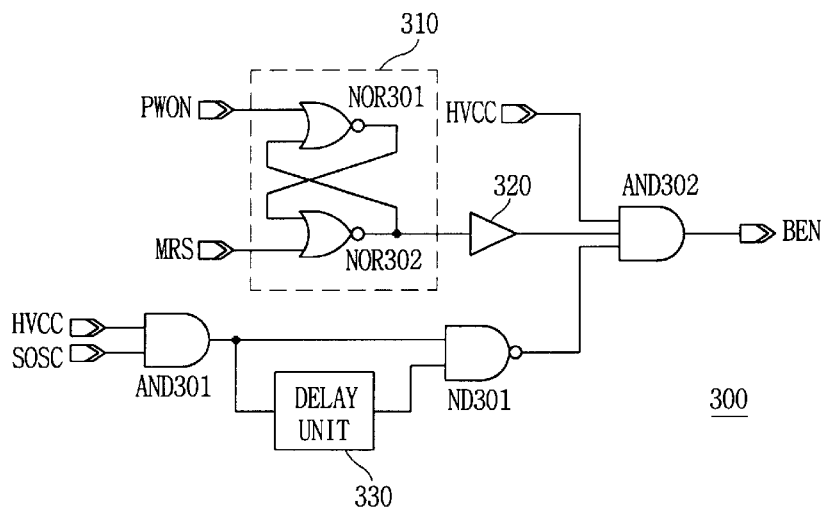

FIG. 11A SOSC 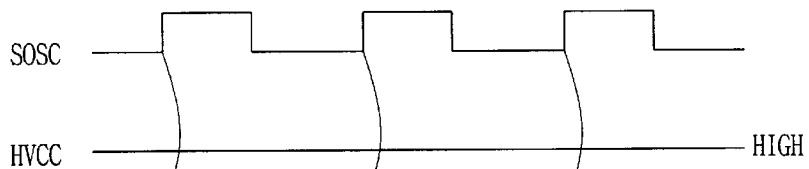
FIG. 11B HVCC 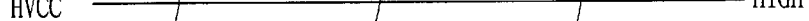 —HIGH
FIG. 11C BEN 
FIG. 11D IADD 
FIG. 11E WLEN0 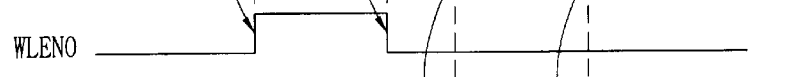
FIG. 11F WLEN1 

BURN-IN TEST CIRCUIT

BACKGROUND OF THE INVENTION

1. Field of the Invention

The present invention relates to a burn-in test circuit, and more particularly, to a burn-in test circuit for a semiconductor memory device which is capable of burn-in testing at a wafer and package level at a low expense with a high efficiency by controlling a level of an external power supply voltage to drive word lines.

2. Description of the Background Art

Burn-in testing is a kind of test to remove any inferiority of a semiconductor memory device in advance that may cause various deficiencies in actual use of the semiconductor memory device. Generally, the testing is performed in a different accelerated condition (i.e., a voltage and a temperature is more highly set) to an actual use of it in order to promote an efficiency of the testing).

FIG. 1 is a schematic block diagram of a semiconductor memory device using a burn-test circuit in accordance with a conventional art.

As shown in the drawing, the burn-in test circuit includes a command decoder 10 for generating a burn-in control signal BEN according to a burn-in command COM generated by an external control circuit (not shown); an auto refresh address counter 20 for generating an internal address signal IADD according to an auto-refresh command AREF; an address multiplexer 30 for multiplexing the internal address signal IADD and an external address signal EADD under the control of the auto-refresh command AREF and generating an address signal ADD used for driving word lines; a row decoder 40 for generating a word line drive signal WLEN upon receipt of the burn-in control signal BEN and the address signal ADD; and a memory cell array 50 having a plurality of memory cells driven by the word line drive signal WLEN.

FIG. 2 is a detailed circuit diagram of a row decoder 40 of the semiconductor memory device using the burn-in test circuit in the conventional art.

A general row decoder has a combination of a plurality of logic gates which receives plural number (N) of address signals ADD0~ADD(n−1) and outputs plural number (2N) of decoding signals AX0~AX(N−1). FIG. 2 shows a circuit diagram of a row decoder 40 in which two address signals ADD0 and ADD1 are decoded.

As shown in the drawing, the row decoder 40 includes a pre-decoder 41 having a first and a second AND gates AND1 and AND2 for ANDing a first and a second address signals ADD0 and ADD1 and outputting a first and a second signals AX0 and AX1, a first and a second inverters INV1 and INV2 for respectively inverting the first and the second address signals ADD0 and ADD1, and a third and a fourth AND gates AND3 and AND4 for ANDing the output signals from the first and the second inverters INV1 and INV2 and outputting a third and a fourth address signals AX2 and AX3; and a word line drive unit 42 having a first PMOS transistor PM1 connected in series to a booster voltage VPP and a ground voltage VSS, a gate of which receives a control signal WPRE, a first to a fourth NMOS transistors NM1~NM4, each gate of which receives a first to a third address signals AX0~AX3, respectively, a third inverter INV3 for inverting a voltage of a drain commonly connected to the first PMOS transistor PM1 and the first NMOS transistor NM1 so as to drive word lines, and a fifth NMOS transistor NM5, a drain of which is commonly connected to the first PMOS transistor PM1 and the first NMOS transistor NM1, a source thereof is connected to the ground voltage VSS, and a gate thereof receives a burn-in enable signal BEN, to thereby simultaneously drive all word lines.

The operation of the semiconductor memory device using the burn-in test circuit in accordance with the conventional art constructed as described above will now be explained with reference to the accompanying drawings.

First, in a burn-in test mode, an accelerated condition suitable for burn-in testing is set at a high voltage and at a high temperature. And, a pre-set burn-in command COM is inputted to generate a burn-in enable signal BEN at the command decoder 10. And then, the semiconductor memory device is set in a state suitable for burn-in testing by using the burn-in enable signal BEN.

In detail, after the semiconductor memory device is set on an accelerated condition suitable for burn-in testing, as shown in FIG. 3A, a pre-set burn-in command COM is applied from an external control circuit (not shown). Then, as shown in FIG. 3B, a burn-in enable signal BEN is accordingly generated from the command decoder 10.

In this respect, when the burn-in enable signal BEN becomes high level, the NMOS transistor NM5 of the row decoder 40 is turned on, according to which all word lines become high level VPP regardless of the internal address signal IADD and the external address signal EADD, and thus, the memory cell is in a suitable state for burn-in testing.

Then, a stress voltage is applied to all word lines by a word line stress input unit (not shown) to perform burn-in testing.

Meanwhile, in a refresh mode, the auto-refresh address counter 20 sequentially increases the internal address signal IADD at every positive edge of the auto-refresh command AREF, that is, a clock signal, so that the memory cells can be sequentially refreshed.

The multiplexer 30 multiplexes the internal address signal IADD or the external address signal EADD under the control of the auto-refresh command AREF and outputs it to the row decoder 40. In case of an auto-refresh mode, the multiplexer 30 selectively inputs the internal address signal IADD to the row decoder 40.

Accordingly, the row decoder 40 decodes the internal address signal IADD to drive selected word lines and performs sequential refreshing operation.

Meanwhile, in a normal operation mode, the multiplexer 30 outputs the external address signal EADD to the row decoder 40, so that the word lines of the memory cell array 40 are driven.

However, referring to the burn-in circuit of the conventional art, since the burn-in command COM is to be inputted from an external source for burn-in testing, an external device is required for generating the burn-in command COM, causing an extra expense for constructing the additional external circuit, and also, since the external burn-in command COM is inputted regardless of the internal state, an efficiency in the burn-in testing is degraded.

SUMMARY OF THE INVENTION

Therefore, an object of the present invention is to provide a burn-in test circuit in which word lines are driven by controlling a level of an external power supply voltage, rather than by a control signal from an external source, so that burn-in testing is performed at a wafer and package level at a low expense with high efficiency.

To achieve these and other advantages and in accordance with the purposed of the present invention, as embodied and broadly described herein, there is provided a burn-in test circuit for semiconductor memory device consisting of a memory cell array having a plurality of memory cells and a row decoder for outputting a word line drive signal so as to drive word lines of the memory cell array, including a reference voltage generating unit for generating a reference voltage; a voltage sensing unit for sensing a power supply voltage level; a self-refresh timer for outputting a clock signal; a burn-in control unit for outputting a burn-in enable signal according to the output signal from the voltage sensing unit and the output signal from the self-refresh timer; an auto-refresh address counter for generating an internal address signal according to the burn-in enable signal of the burn-in control unit and the auto-refresh command; and a multiplexer for multiplexing the external address signal and the internal address signal under the control of the auto-refresh command and the burn-in control signal.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 3A–3D is a view showing an operation timing when the burn-in test circuit is operated in a burn-in test mode in accordance with the conventional art;

FIGS. 4A–4E is a view showing an operation timing when the burn-in test circuit is operated in a normal mode in accordance with the conventional art;

FIGS. 7A–7C is a view of an operation timing of the voltage sensing unit of FIG. 6 in accordance with the present invention;

FIG. 8 is a detailed circuit diagram of a burn-in control unit of FIG. 5 in accordance with the present invention;

FIGS. 11A–11F is a view of an operation timing of the burn-in test circuit of FIG. 5 in accordance with the present invention.

DETAILED DESCRIPTION OF THE PREFERRED EMBODIMENTS

Reference will now be made in detail to the preferred embodiments of the present invention, examples of which are illustrated in the accompanying drawings.

Figure 1:
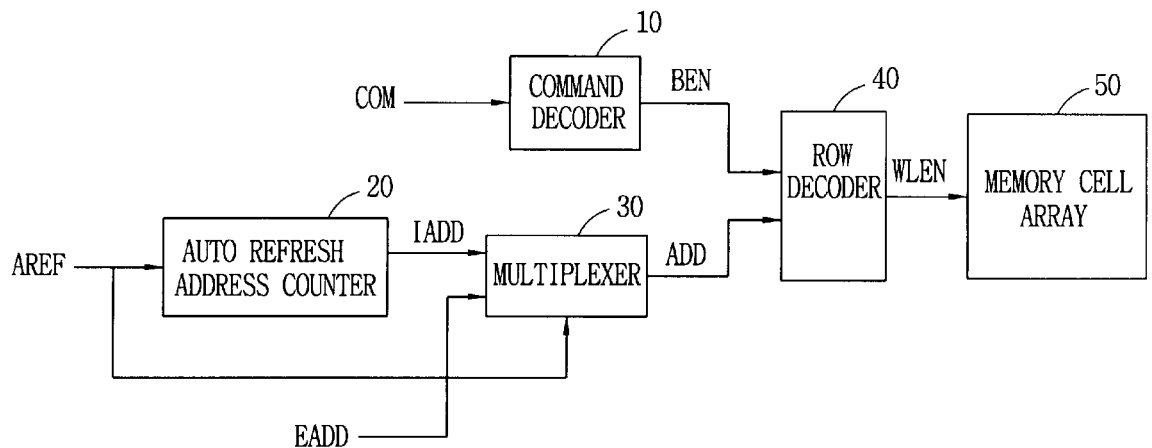
FIG. 1 is a schematic block diagram of a semiconductor memory device using a burn-in test circuit in accordance with a conventional art.
Figure 2:
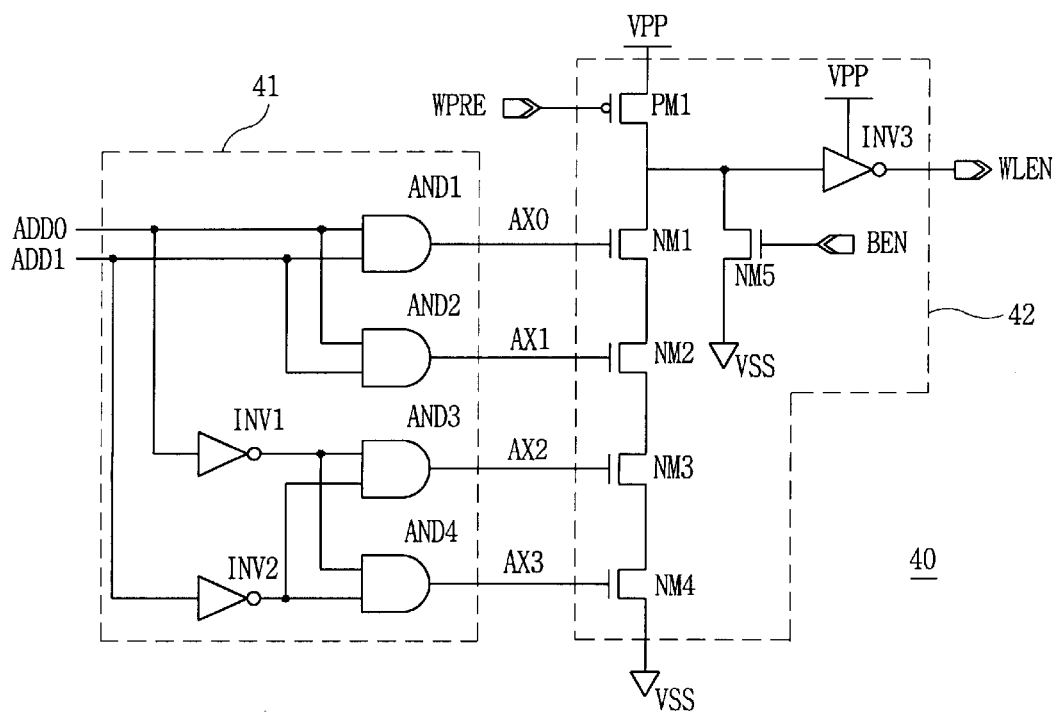
FIG. 2 is a detailed circuit diagram of a row decoder of FIG. 1 in accordance with the conventional art.
Figure 5:
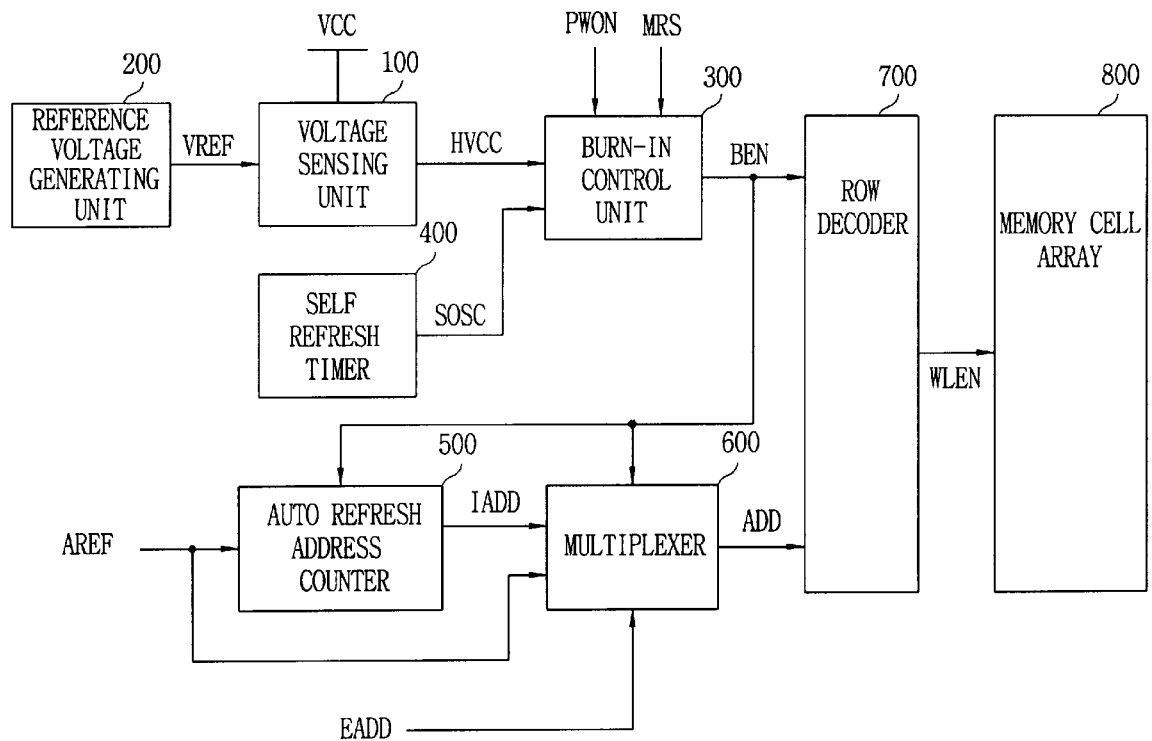
FIG. 5 is a schematic block diagram of a semiconductor memory device using a burn-in test circuit in accordance with the present invention.

FIG. 5 is a schematic block diagram of a semiconductor memory device using a burn-in test circuit in accordance with the present invention.

As shown in the drawing, a semiconductor memory device using a burn-in test circuit includes a reference voltage generating unit 200 for generating a reference voltage VREF; a voltage sensing unit 100 for sensing a power supply voltage VCC level; a self-refresh timer 400 for outputting a clock signal SOSC; a burn-in control unit 300 for outputting a burn-in enable signal BEN according to the output signal HVCC from the voltage sensing unit 100 and the output signal SOSC from the self-refresh timer 400; an auto-refresh address counter 500 for generating an internal address signal IADD according to the burn-in enable signal BEN of the burn-in control unit 300 and the auto-refresh command AREF; and a multiplexer 600 for multiplexing the external address signal EADD and the internal address signal IADD under the control of the auto-refresh command and the burn-in control signal; a row decoder for outputting a word line drive signal WLEN selecting a specific word line according to an output signal from the multiplexer 600 under the control of the burn-in enable signal BEN; and a memory cell array 800 having a plurality of memory cells driven by the word line drive signal WLEN.

Figure 6:
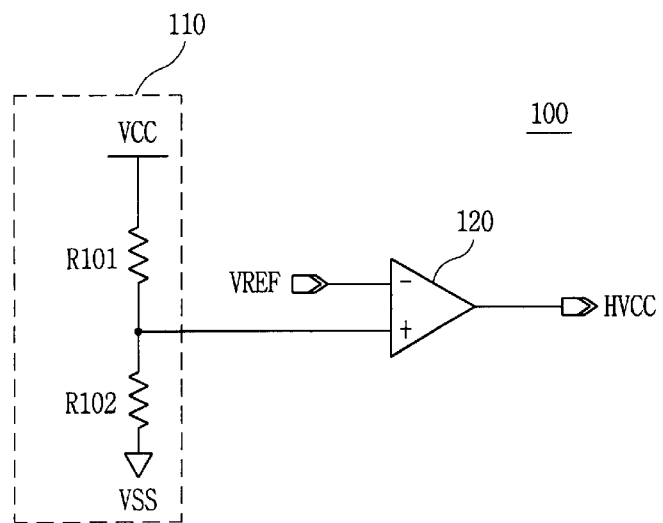
FIG. 6 is a detailed circuit diagram of a voltage sensing unit of FIG. 5 in accordance with the present invention.

FIG. 6 is a detailed circuit diagram of a voltage sensing unit 100 of FIG. 5 in accordance with the present invention.

As shown in the drawing, the voltage sensing unit 100 includes a voltage distribution unit 110 having a first resistance R101 and a second resistance R102 connected in series between the power supply voltage VCC and a ground voltage VSS; and a differential amplifier 120 having a '+' input terminal to which an output signal from the voltage distribution unit 110, that is, a voltage VDET at a node where the first resistance R101 and the second resistance R102 are commonly connected, is applied, and a '−' input terminal to which an output signal from the reference voltage generating unit 200, that is, a reference voltage VREF, is applied, and outputting a comparison result HVCC.

As to the voltage sensing unit 100, as shown in FIG. 7A, when the external power supply voltage VCC is gradually increased from the ground voltage VSS and goes beyond the reference voltage, the internal power supplies of the semiconductor memory device become stable, and as shown in FIG. 7C, a power supply enable signal PWON is outputted as a pulse signal.

Subsequently, the power supply voltage VCC is continuously increased and becomes more than an arbitrarily pre-set level, as shown in FIG. 7B, the output signal HVCC is outputted on a high level from the voltage sensing unit 100.

The arbitrarily pre-set level is, for example, set as a pre-set voltage according to following function.

$$VRA = \frac{(R101 + R102)}{R102} \times VREF$$

FIG. 8 is a detailed circuit diagram of a burn-in control unit 300 of FIG. 5 in accordance with the present invention.

As shown in the drawing, the burn-in control unit 300 includes a latch 310 having a first and a second NOR gates NOR301 and NOR302 each receiving the power supply enable signal PWON and the register setting command MRS at a reset terminal R and a set terminal S thereof; a buffer 320 for buffering an output signal from the latch 310; a first AND gate AND301 for ANDing the output signal VCC from the voltage sensing unit 110 and the output signal SOSC from the self-refresh timer 400; a delay unit 330 for delaying an output signal from the first AND gate AND301; a NAND gate ND301 for NANDing an output signal from the delay unit 330 and an output signal from the first AND gate AND301; and a second AND gate AND302 for ANDing an output signal from the NAND gate ND301, an output signal from the buffer 320 and the output signal HVCC from the voltage sensing unit 100, and outputting the burn-in enable signal BEN.

Figure 9:
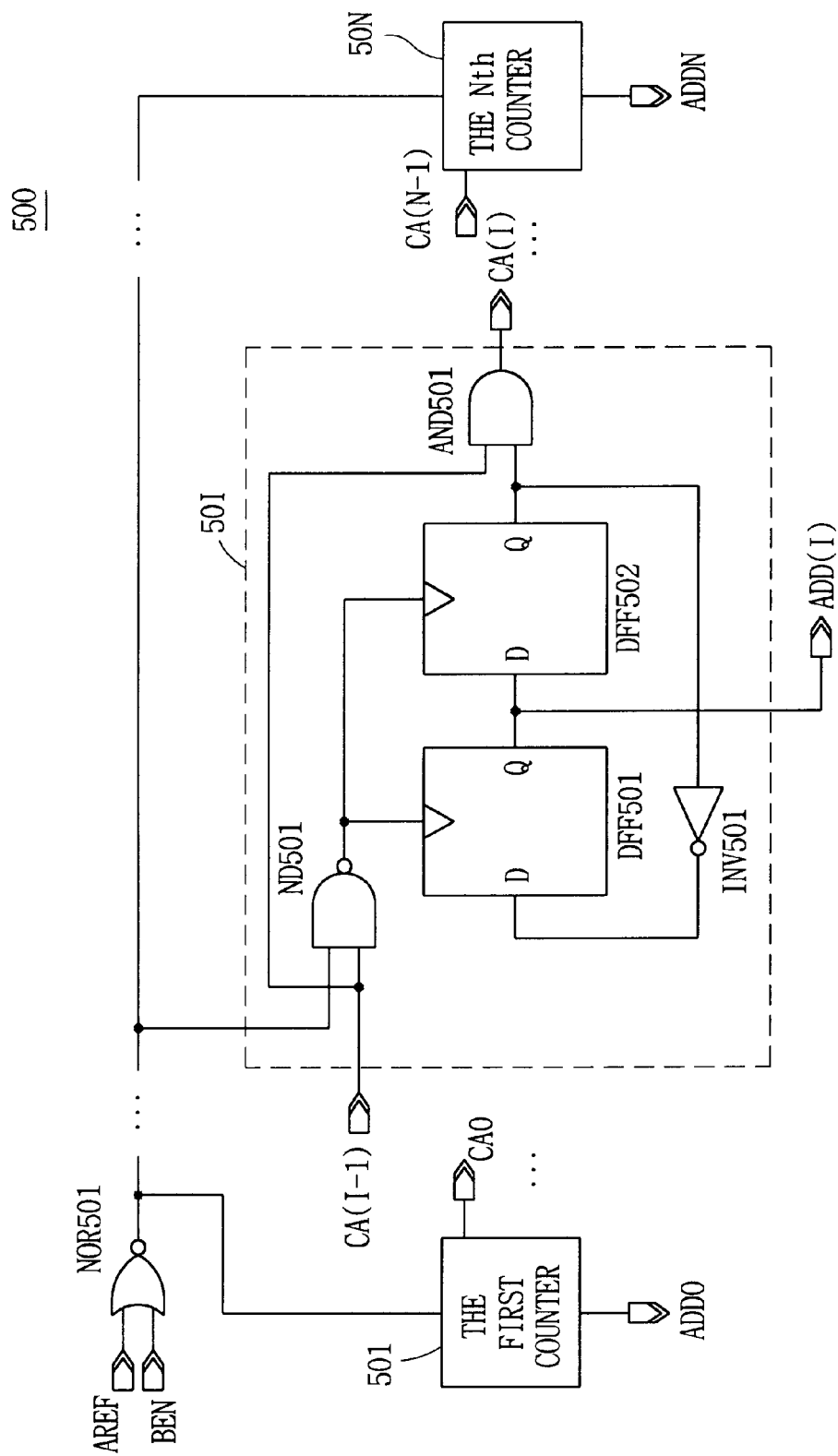
FIG. 9 is a detailed circuit diagram of an auto-refresh address counter of FIG. 5 in accordance with the present invention.

FIG. 9 is a detailed circuit diagram of an auto-refresh address counter 500 of FIG. 5 in accordance with the present invention.

As shown in the drawing, the auto-refresh address counter 500 includes a first NOR gate NOR501 for NORing the auto-refresh command AREF and a burn-in control signal BEN; and a plurality of counters 501~50N receiving the output signal from the first NOR gate NOR501 and a carry CA(I–1) of a previous counter 50(I–1). One counter 501 out of the plurality of counters 501-50N includes a first NAND gate ND501 for NANDing an output signal from the first NOR gate NOR501 and the carry CA(I–1) of the previous counter; a first D flipflop DFF501 for receiving an output signal from the first NAND gate ND501 at an inverting clock input terminal thereof and outputting the internal address signal IADD; a second D flipflop FFF502 for receiving an output signal from the first D flipflop EFF501 at its data input terminal D and receiving the output signal from the first NAND gate ND501 at its clock input terminal; a first inverter INV501 for inverting a data output Q from the second D flipflop DFF502 and outputting it to the data input terminal D of the first D flipflop DFF501; and a second AND gate AND502 for ANDing the carry CA(I–1) of the previous counter 50(I–1) and the data output of the second flipflop DFF502, and generating a carry CA(I).

Figure 10:
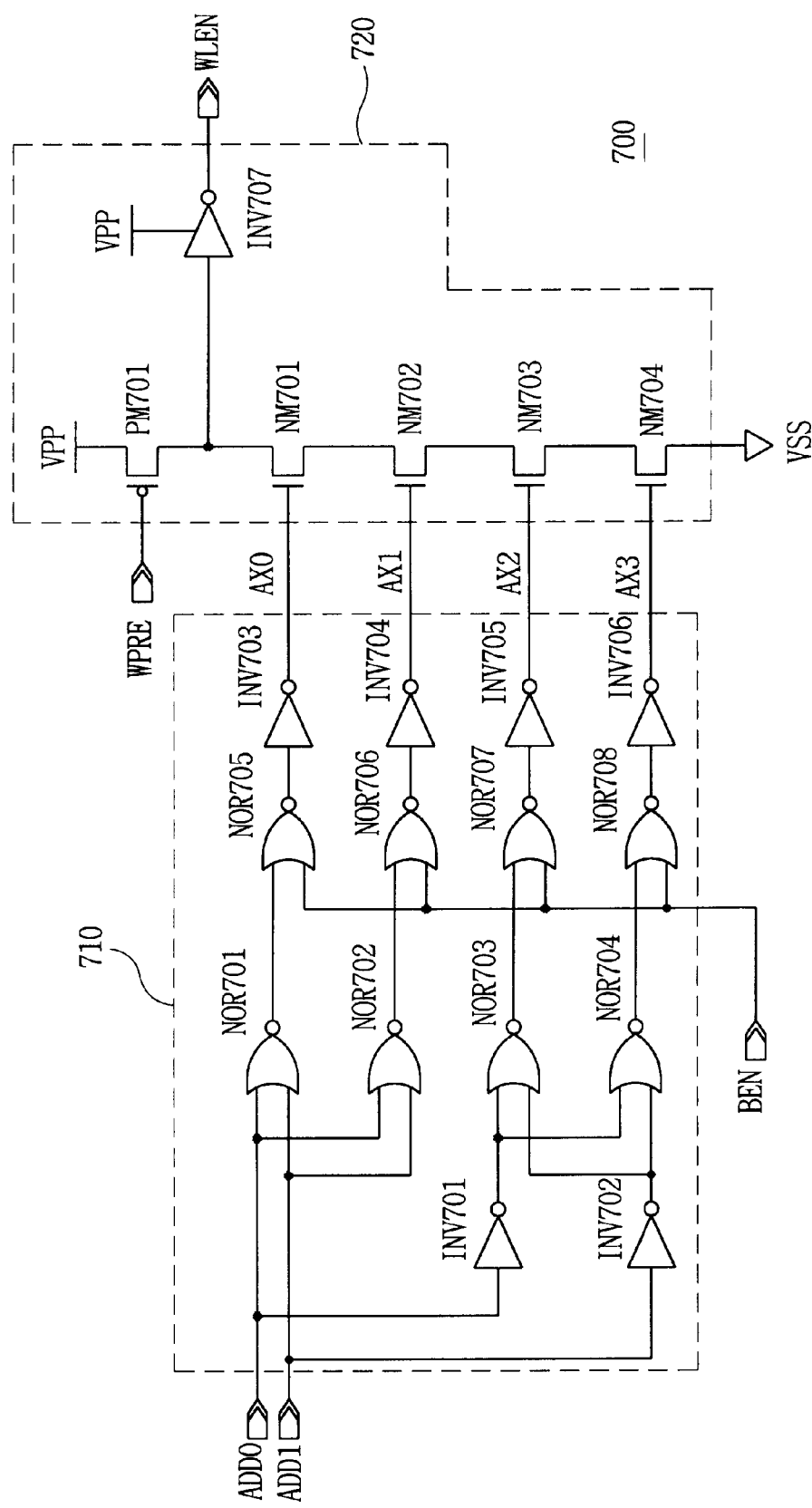
FIG. 10 is a detailed circuit diagram of a row decoder of FIG. 5 in accordance with the present invention.

FIG. 10 is a detailed circuit diagram of a row decoder 700 of FIG. 5 in accordance with the present invention. The row decoder is one for the uppermost bit MSB. As shown in the drawing, the row decoder 700 includes a pre-decoder 710 for address-decoding an input address signal; and a main decoder 720 for driving word lines.

Assuming that the semiconductor memory device of the present invention has a capacity of 16M DRAM, it has 12 row addresses in number. Four lower addresses A8~A11 are used to select four blocks from 64 256 Kb blocks, and 256 word lines are selected in each block by using the 8 upper addresses A0~A7.

The pre-decoder 710 decodes the 8 upper address signals ADD0~ADD7 of the external address signal EADD or the internal address signal IADD selectively outputted by the multiplexer 600. Here, the case where the first and the second address signals ADD0 and ADD1 are decoded among the upper addresses will now be explained.

As shown in the drawing, the pre-decoder 710 includes a first inverter INV701 for inverting the first address signal ADD0; a second inverter INV702 for inverting the second address signal ADD1, a first and a second NOR gates NOR701 and NOR702 for NORing the first and the second address signals ADD0 and ADD1; a third and a fourth NOR gates NOR703 and NOR704 for NORing signals respectively inverted by the first and the second inverters INV701 and INV702 over the first and the second address signals ADD0 and ADD1; a fifth to an eighth NOR gates NOR705 to NOR708 for respectively NORing the output signal from the first to the fourth NOR gates NOR701 to NOR704 and the burn-in enable signal BEN; and a third to sixth inverters INV703 to INV706 for respectively inverting the output signal from the fifth to the eighth NOR gates NOR705 to NOR708.

The main decoder 720 includes a first PMOS transistor PM701 connected in series between the drive voltage VPP and the ground voltage VSS and having a gate to which a control signal WPRE is applied; a first to a fourth NMOS transistors NM701 to NM704 each having a gate to which a first to a fourth address signals AX0~AX3 are applied; and a seventh inverter INV707 for inverting a voltage at the drain where the first PMOS transistor PM701 and the first NMOS transistor NM701 are commonly connected, so as to drive word lines.

The operation of the semiconductor memory device using the burn-in test circuit constructed as described above will now be explained with the accompanying drawings.

First, as to the burn-in test circuit, in case that an external power supply voltage VCC is applied beyond an arbitrarily pre-set level, the voltage sensing unit 100 senses it, and accordingly, the burn-in control unit 300 outputs the burn-in control signal BEN, so that it is automatically switched to a burn-in test mode.

In the burn-in test mode, more word lines than in the normal mode can be driven according to the cycle of a timer arbitrarily set by the self-refresh timer 400, that is, an internal timer, having an arbitrary cycle, and the auto-refresh address counter 500.

In detail, in the burn-in control unit 300, in the state that the output signal of the second NOR gate NOR301 of the latch 310 becomes a high level as a high level pulse of the power supply enable signal PWON is inputted thereto, the sensing signal HVCC of the voltage sensing unit 100 becomes a high level, and as shown in FIG. 11A, when the output signal SOSC of the self-refresh timer 400 is applied, the burn-in control signal BEN is outputted as a clock signal as shown in FIG. 11C.

Accordingly, when the burn-in enable signal BEN, the clock signal, is applied to the auto-refresh address counter 500, the internal address signal IADD is sequentially varied at a negative edge of the burn-in enable signal BEN. The varied internal address signal IADD is selected by the multiplexer controlled by the burn-in enable signal BEN, so as to be outputted.

Subsequently, the internal address signal outputted through the multiplexer 600 is decoded by the pre-decoder 710 and outputted to the main decoder 720, the main decoder 720 drives more word lines than that in performing a normal operation.

Therefore, since the plurality of word lines are sequentially driven according to the cycle of the self-refresh timer 400, burn-in testing can be performed in a similar state to an actual operation.

In addition, a mode register setting command MRS is inputted into the burn-in control unit 300, enabling a reset function of the burn-in enable signal BEN, so that the burn-in testing may be stopped and the normal mode operation can be performed even in a state that the sensing signal HVCC is enabled on a high level.

As so far described, according to the semiconductor memory device using the burn-in test circuit of the present invention, the word lines are driven by controlling the level of the external power supply voltage VCC, rather than performing a burn-in testing according to an externally generated command, so that burn-in testing can be performed at the wafer and the package level at a low expense with high efficiency.

In addition, the burn-in test mode reset function can be performed, which makes the normal mode testing to be possible even in a high level power supply voltage VCC.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A burn-in test circuit for semiconductor memory device consisting of a memory cell array having a plurality of memory cells and a row decoder for outputting a word line drive signal so as to drive word lines of the memory cell array, comprising:

a reference voltage generating unit for generating a reference voltage;

a voltage sensing unit for sensing a power supply voltage level;

a self-refresh timer for outputting a clock signal;

a burn-in control unit for outputting a burn-in enable signal according to the output signal from the voltage sensing unit and the output signal from the self-refresh timer;

an auto-refresh address counter for generating an internal address signal according to the burn-in enable signal of the burn-in control unit and the auto-refresh command; and a multiplexer for multiplexing the external address signal and the internal address signal under the control of the auto-refresh command and the burn-in control signal.

2. The burn-in test circuit according to claim 1, wherein the voltage sensing unit includes:

a voltage distribution unit having a first resistance and a second resistance connected in series between the power supply voltage and a ground voltage; and a comparing unit having a '+' input terminal to which an output signal from the voltage distribution unit is applied, and a '−' input terminal to which a reference voltage of the reference voltage generating unit is applied, and outputting a comparison result.

3. The burn-in test circuit according to claim 1, wherein the burn-in control unit includes:

a latch having a first and a second NOR gates each receiving the power supply enable signal and the register setting command at a reset terminal and a set terminal thereof;

a buffer for buffering an output signal from the latch;

a first AND gate for ANDing the output signal from the voltage sensing unit and the output signal from the self-refresh timer;

a delay for delaying an output signal from the first AND gate;

a NAND gate for NANDing an output signal from the delay unit and an output signal from the first AND gate; and a second AND gate for ANDing an output signal from the NAND gate, an output signal from the buffer and the output signal from the voltage sensing unit, and outputting the burn-in enable signal.

4. The burn-in test circuit according to claim 1, wherein the auto-refresh address counter includes:

a first NOR gate for NORing the auto-refresh command and a burn-in control signal; and a plurality of counters receiving the output signal from the first NOR gate and a carry of a previous counter.

5. The burn-in test circuit according to claim 4, wherein one counter out of the plurality of counters includes:

a first NAND gate for NANDing an output signal from the first NOR gate and the carry of the previous counter;

a first flipflop for receiving an output signal from the first NAND gate at an inverting clock input terminal thereof and outputting the internal address signal;

a second flipflop for receiving an output signal from the first flipflop at its data input terminal and receiving the output signal from the first NAND gate at its clock input terminal;

a first inverter for inverting a data output from the second flipflop and outputting it to the data input terminal of the first flipflop; and a second AND gate for ANDing the carry of the previous counter and the data output of the second flipflop, and generating a carry.

6. The burn-in test circuit according to claim 1, wherein the row decoder includes a pre-decoder for decoding an input address signal, and a main decoder for driving word lines.

7. The burn-in test circuit according to claim 6, wherein the pre-decoder decodes an upper address signal among output signals from the multiplexer.

8. The burn-in test circuit according to claim 6, wherein the pre-decoder includes:

a plurality of inverters for inverting each address signal, respectively;

a plurality of NOR gates for combining each address signal;

a plurality of NOR gates for combining the output signals from the plurality of inverters;

a plurality of NOR gates for combining the output signals from each NOR gate and a burn-in enable signal; and a plurality of inverters for inverting output signals from each NOR gate.

9. The burn-in test circuit according to claim 6, wherein the main decoder includes:

a first PMOS transistor connected in series between a drive voltage and a ground voltage, having a gate to which a first control signal is applied;

a plurality of NMOS transistors each having a gate to which the output signals from the pre-decoder are respectively applied; and an inverter for inverting a voltage of a drain of the first PMOS transistor so as to output a word line drive signal.

* * * * *